United States Patent
Grotmol

(10) Patent No.: US 7,180,433 B1
(45) Date of Patent: Feb. 20, 2007

(54) FAST DATA COMPRESSION AND DECOMPRESSION SYSTEM AND METHOD

(75) Inventor: Øyvind Grotmol, Oslo (NO)

(73) Assignee: Tandberg Storage ASA, Oslo (NO)

( * ) Notice: Subject to any disclaimer, the term of this patent is extended or adjusted under 35 U.S.C. 154(b) by 0 days.

(21) Appl. No.: 11/233,858

(22) Filed: Sep. 22, 2005

(51) Int. Cl.
*H03M 7/34* (2006.01)
*H03M 7/38* (2006.01)

(52) U.S. Cl. .......................................... 341/51; 341/50

(58) Field of Classification Search ................ 341/51, 341/50, 87, 106
See application file for complete search history.

(56) References Cited

U.S. PATENT DOCUMENTS

| | | | |
|---|---|---|---|
| 5,150,430 A | 9/1992 | Chu | |
| 5,384,567 A * | 1/1995 | Hassner et al. | 341/51 |
| 5,652,878 A | 7/1997 | Craft | |
| 5,771,010 A | 6/1998 | Masenas | |
| 5,771,011 A | 6/1998 | Masenas | |
| 5,903,230 A | 5/1999 | Masenas | |
| 5,929,791 A | 7/1999 | Masenas | |
| 6,208,273 B1 | 3/2001 | Dye et al. | |
| 6,281,816 B1 * | 8/2001 | Kampf | 341/87 |
| 6,657,565 B2 * | 12/2003 | Kampf | 341/51 |
| 6,693,567 B2 | 2/2004 | Cockburn et al. | |
| 6,822,589 B1 | 11/2004 | Dye et al. | |

FOREIGN PATENT DOCUMENTS

WO   WO 03/096543   11/2003

OTHER PUBLICATIONS

A Universal Algorithm for Sequential Data Compression—Jacob Ziv et al—IEEE Transactions on Information Theory, vol. IT-23, No. 3 May 1977 p. 337-342.
"Parallel Architecture for High-Speed Lempel-Ziv Data Coding/Decoding" Systems and Computers in Japan, vol. 29, No. 8, 1998 Scripta Technica XP-000782351, No Month.
Unified VLSI Systolic Array Design for LZ Data Compression-Hwang et al-IEEE Trans. On Very Large Scale Integration vol. 9, No. 4 Aug. 2001.

* cited by examiner

*Primary Examiner*—Peguy JeanPierre
(74) *Attorney, Agent, or Firm*—Schiff Hardin LLP

(57) ABSTRACT

In a system and method for multi-byte data compression and decompression, previously received data bytes of uncompressed data are stored. The stored previously received data bytes are compared to currently received data bytes to determine whether at least one or more of the data bytes match at least one or more of the stored data bytes. An address of matching stored data bytes is generated. In data compression, a tree module is used for the storing, comparing and generation of addresses. An optimized operation order with parallel distribution of control and data signals, and a central control word register are used to obtain high speed compression. In data compression, a memory system is provided comprising a first RAM which stores even history buffer positions and a second RAM which stores odd history buffer positions.

19 Claims, 5 Drawing Sheets

FAST DATA COMPRESSION AND DECOMPRESSION SYSTEM AND METHOD

BACKGROUND

The present preferred embodiment is directed to an apparatus and method for compressing and decompressing data, and more specifically to sequential data compression and decompression at high speed.

Many types of data compression systems exist. One commonly used technique is the Lempel-Ziv algorithm which is described in "Compression of Individual Sequences via Variable Rate Coding" by Lempel and Ziv in IEEE Transactions on Information Theory, September, 1977, pages 530–536.

The Lempel-Ziv compression algorithm is a variable rate coding technique. One of the primary problems with implementations of the Lempel-Ziv compression technique is the difficulty in performing the search operation for previous matching strings at an effective processing speed.

Today the Lempel-Ziv technique is being used in tape drivers, among other places. The primary problem in implementing the algorithm is obtaining high data rates, even when implemented in hardware. One example of prior art is U.S. Pat. No. 5,652,878. This architecture achieves a speed of one byte per clock cycle.

With the increased capabilities of the mechanical parts of tape drivers and the ever increasing demand for bandwidth, single byte compression is no longer adequate. For a given silicon technology it is impossible to increase the clock frequency above a certain limit without violating signal delay constraints, thus effectively limiting the maximum achievable bandwidth of the prior art. Furthermore, there are issues related to power consumption when increasing the clock frequency.

The compression method presented by Craft (U.S. Pat. No. 5,612,878) is inherently a sequential process which does not easily lend itself to parallelization. Making any system capable of compressing several bytes per cycle is a very significant technical challenge. It is very difficult to construct a system to obtain a real increase in bandwidth. Such systems would give a correspondingly longer delay on the critical path, thereby reducing the clock frequency and offsetting the whole advantage of processing several bytes at a time.

FIG. 1 shows an operations order (system critical path) of a prior art Lempel-Ziv data compression engine having the above-described disadvantages, as disclosed in U.S. Pat. No. 5,612,878. At the beginning of the critical path, a central data register 2 is provided which is connected to receive a clock signal 102 and has a distribute output to a comparator 3 which compares values locally. The comparator 3 has a collect output to a calculation unit 4, which calculates control signals centrally. The calculation unit 4 has a distribute output to an execution unit 5 which executes commands locally. Execution unit 5 outputs to a register 6 which stores historic data locally. Register 6 also is connected to receive a clock signal 102.

SUMMARY

It is an object to solve one or more of the problems described above.

In a system and method for multi-byte data compression and decompression, previously received data bytes of uncompressed data are stored. The stored previously received data bytes are compared to currently received data bytes to determine whether at least one or more of the data bytes match at least one or more of the stored data byes. An address of matching stored data bytes is generated.

In data compression, a tree module is used for the storing, comparing and generation of addresses.

An optimized operation order with parallel distribution of control and data signals, and a central control word register are used to obtain high speed compression.

In data compression, a memory system is provided comprising a first RAM which stores even history buffer positions and a second RAM which stores odd history buffer positions.

DESCRIPTION OF THE PREFERRED EMBODIMENT

Figure 1:
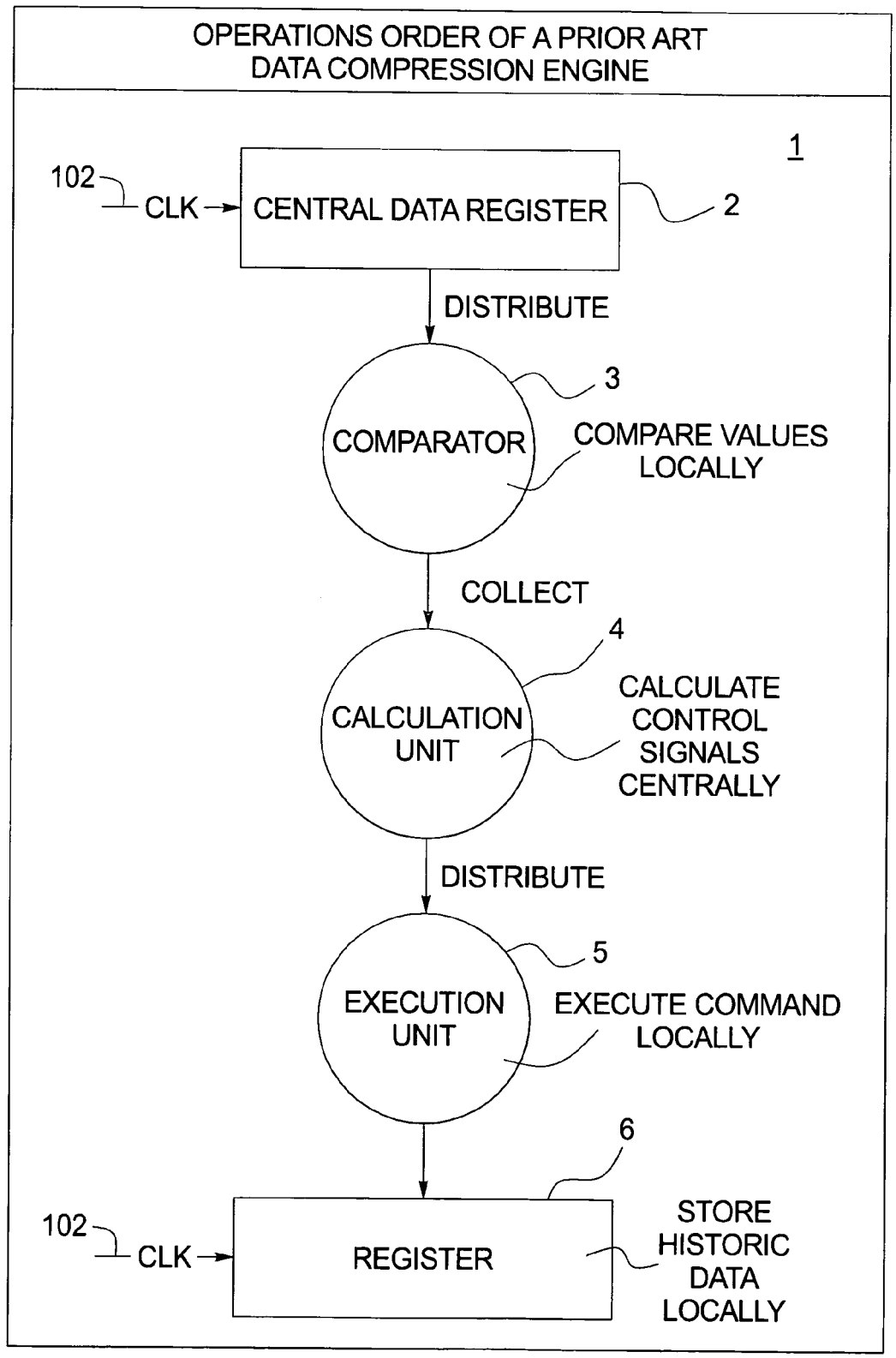
FIG. 1 shows an operations order flow in a prior art Lempel-Ziv data compression engine.

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

Figure 2:
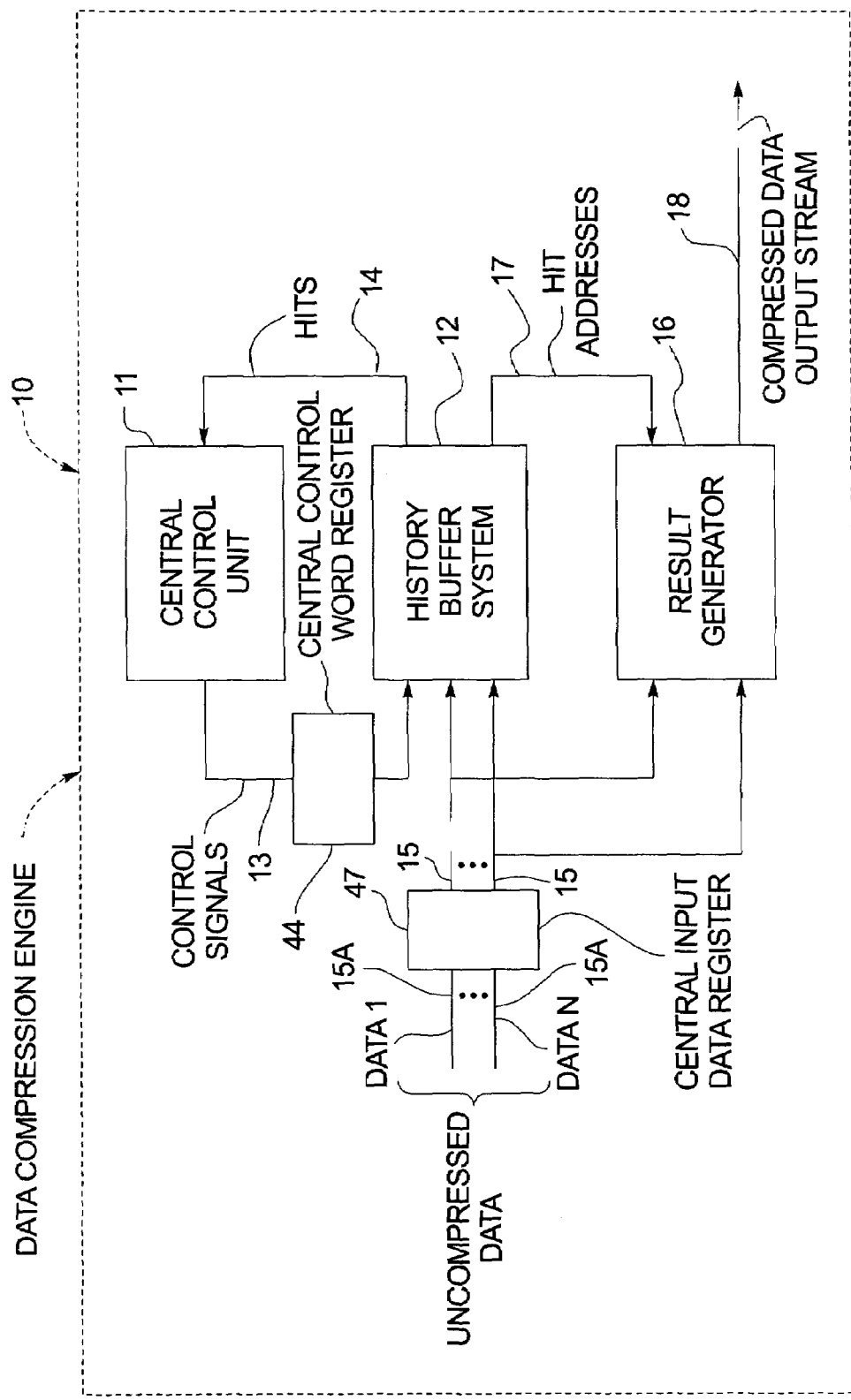
FIG. 2 is an improved Lempel-Ziv multi-byte data compression engine providing a fast information gathering and control system.

The data compression engine 10 of FIG. 2 compresses multiple bytes every clock cycle, avoids significant delay increases, maintains almost a same clock frequency as with a single byte solution, and achieves an increase in bandwidth.

The improved Lempel-Ziv multi-byte data compression engine providing a fast information gathering and control system is shown schematically at 10 in FIG. 2, and compresses several bytes every clock cycle. The system 10 comprises a central control unit 11, a history buffer system 12, and a result generator 16. The central control unit 11 outputs on control signal lines 13 through central control word register 44 control signals which are input to the history buffer system 12. The history buffer system 12 has output hit reduction lines 14, indicating hits as described hereafter, running back to the central control unit 11.

Multi-byte data input lines 15A are connected to a central input data register 47 for input of the multiple bytes DATA1 . . . DATAN of the uncompressed data. The register 47 outputs these uncompressed data at 15A to the history buffer system 12 and also to the result generator 16. Hit addresses, described hereafter, are output on hit address lines 17 from the history buffer system 12 to the result generator 16. The result generator 16 outputs on line 18 a compressed data output stream.

Figure 3:
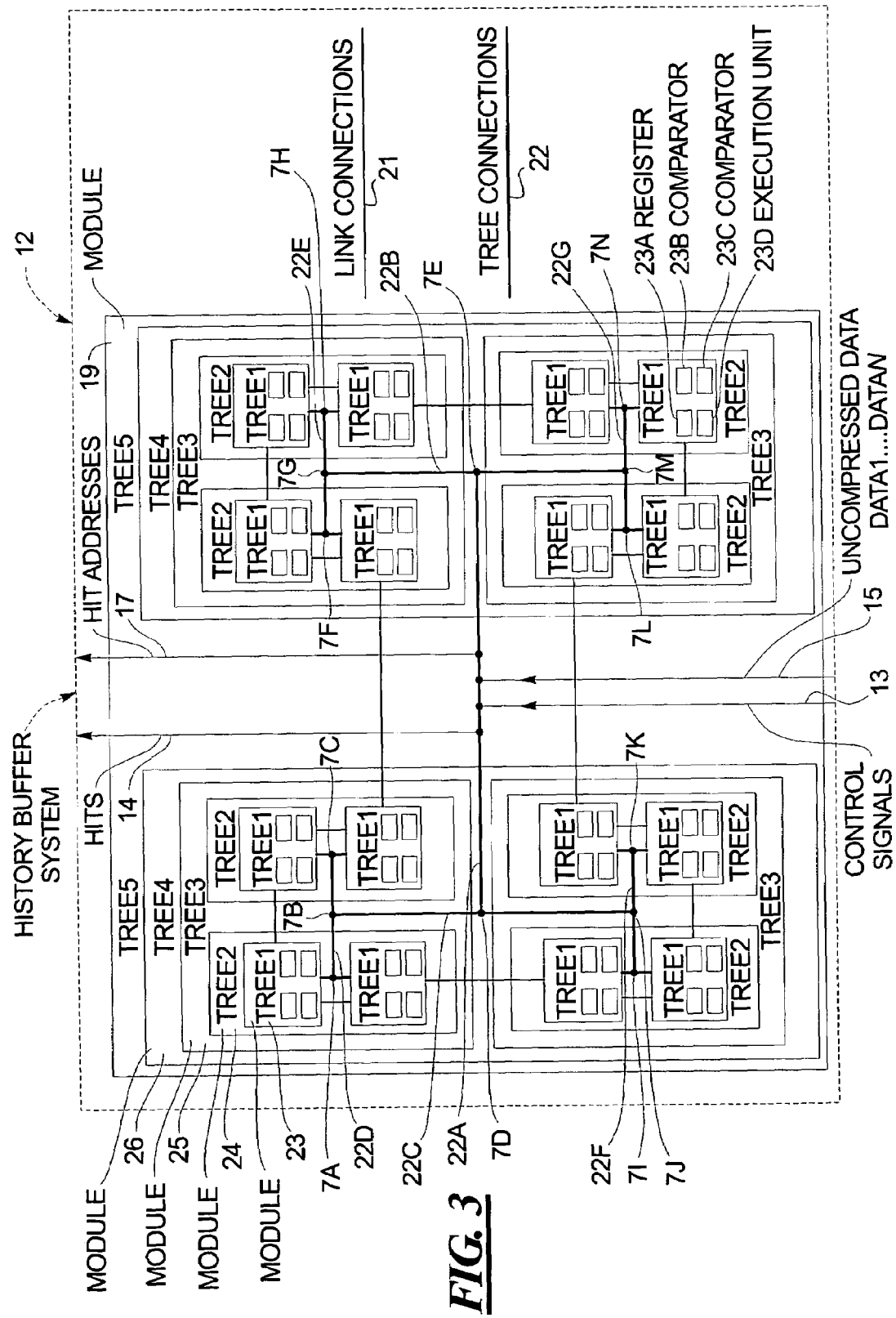
FIG. 3 is a configuration and layout of the history buffer system shown in FIG. 2 and which is a circularly linked H-tree with five levels of module hierarchy and sixteen leaf modules.

The history buffer system 12 comprises, as also described hereafter in FIG. 3, registers 23A, data comparators 23B and 23C, execution units 23D, a string identifier logic, a selector logic, and an address generation system. The problem in the prior art with compressing data fast is that what is to be done with one byte inherently depends on what was done with all the previous ones. Thus, the natural proceeding is sequential, compressing the bytes one after another. In the multi-byte solution of FIGS. 2 and 3, intelligent nodes (tree1 leaf modules 23) are assigned in a tree structure shown in FIG. 3. The old data bytes (the 1024 latest in a typical tape streamer application) are stored in these intelligent nodes (tree1 leaf modules 23), and the new data bytes are distributed to these intelligent nodes for comparison.

The history buffer system 12 formed as a circularly linked H-tree layout as shown in FIG. 3 will now be described. The link connections are shown by medium thick lines 21, and the tree connections are shown by thicker lines 22. The system 12 comprises tree1 leaf modules 23, tree2 modules 24, tree3 modules 25, tree4 modules 26, and tree5 module 19. They are interconnected as shown by the link connection lines 21 and tree connection lines 22.

The uncompressed data bytes 15 are input at a central tree connection segment 22A and are then distributed from there to tree connection segments 22B–22E to all of the tree1 leaf modules 23. The system 12 shown in FIG. 3 is designed for two bytes per clock signal, but also could be designed for more than two bytes. Also the system 12 shown in FIG. 3 is designed for a history window length of 16 bytes, and therefore 16 tree1 leaf modules 23 are provided. Of course a different history window length can also be designed with a corresponding differing number of tree1 leaf modules being employed corresponding to that different history window length. In this case, the number of levels in the hierarchy would also vary. With n levels, up to $2^n$ leaf nodes can be used.

The string identifier logic will now be described. Each of the tree1 leaf modules has a register 23A and, for this two byte per clock cycle embodiment, first and second comparators 23B and 23C. For each and every data byte that enters, it is stored in exactly one of the tree1 leaf module registers 23A; and every incoming data byte is compared in comparators 23B and 23C against all the data stored in the history buffer system. The comparators 23B, 23C match single bytes. Longer matching sequences need to be identified. In order to accomplish that, the comparison match results, as described hereafter, are transferred on the link connections 21 through the tree1 leaf modules 23. The tree connections 22 are used for distributing data and control signals from the central control unit 11 to all of the tree1 leaf modules 23, and for matching results from all of the tree1 leaf modules 23. The link connections 21 are used for communicating among the tree1 leaf modules 23 in a circularly linked fashion.

Now the selector logic and address generation system will be described. Given a plurality of string matches, one of them must be selected. The selector logic retrieves the string match results from all of the tree1 leaf modules 23 through the tree connections 22, and at each level selects the match with the lowest address. At the same time, an address needs to be generated. This is the address generation system referred to above. The address is built gradually at each level in the tree hierarchy and an additional bit is added to the addresses. At the top level, there is only one generated address giving the position of the first string match hit within the entire history buffer system.

For each sequence match, it is necessary to know the location within the history buffer system containing the first byte of the string match. This is calculated as the address of the generated address minus the length of the matching string plus one.

An important aspect of the history buffer system 12 is in the way the results are gathered. Several new bytes are distributed every clock cycle, and the results are gathered on the several comparison hit reduction lines 14. For compression of x bytes per cycle, $x*(x+1)/2+1$ such hit reduction lines 14 are needed. All the information necessary to decide what do for all of the x bytes is gathered at once. Each of the hit reduction lines 14 represents a specific case that needs to be considered. The vital information is whether there is a hit on a consecutive string of bytes of length at least two, and there are $x*(x+1)/2$ such possible strings from x+1 bytes (the previous byte must be taken into consideration). Furthermore, it is necessary to report a hit on the last byte, bringing the number up to $x*(x+1)/2+1$. Thus, for example, two bytes per cycle as shown in the FIG. 3 embodiment would require 4 such hit reduction lines 14.

Each of these hit reduction lines 14 is reduced by an or-operation at each and every tree connection intersection 7A–7N (that is, the hit reduction line 14 is high if and only if at least one of the tree1 leaf modules 23 reported a hit of that specific kind). The central control unit 11 (FIG. 2) only sees these few reduced hit reduction lines, and does not have to deal in particular with each of the intelligent nodes (tree1 leaf modules 23). Thus, the central control unit 11 is small in size and fast. The intelligent nodes (tree1 leaf modules 23) must also be instructed as to what actions to perform. The two possible actions are reporting a hit for registration of the address by the address generator, and reporting a hit to the next intelligent node for use in a next cycle. What actions an intelligent node should take only depend on its own hit information and the hit reduction lines, so the central control unit 11 calculates the commands and broadcasts them to the intelligent nodes. The number of control signal lines 13 necessary to issue the commands is linear in comparison to the number of bytes to be compressed every cycle.

The most time-consuming parts of the data compression engine of FIGS. 2 are the system line delays, the time for the signals to travel, both the reduction of the hit information from the intelligent nodes to the central control unit 11, and the distribution of data and control signals from the central unit 11 to the intelligent nodes. An important advantage of this system is that all the information is gathered in parallel, and all the control signals are distributed in parallel. Thus, the only difference in clock frequency from a single byte solution is the small reduction due to increased processing locally, but the global communication takes the same amount of time.

Whereas previously mentioned U.S. Pat. No. 5,652,878 teaches an array as an arrangement for the intelligent nodes, the circularly linked H-tree history buffer system 12 of FIG. 3 disclosed herein is a structure which provides efficient layout of tree structures on silicon, and includes connecting neighboring nodes in a circular way. Thus, the structure serves three purposes:

1. Information retrieval from the tree1 leaf modules 23 (intelligent nodes) to the central unit 11;
2. Control signal distribution from the central control unit 11 to the tree1 leaf modules 23; and
3. Communication between the tree1 leaf modules 23 on the link connections 21.

The operations order of the improved data compression engine shown in FIG. 4 will now be described. This operations order provides significant speed increases compared to the slower prior art operations order previously described in FIG. 1.

Figure 4:
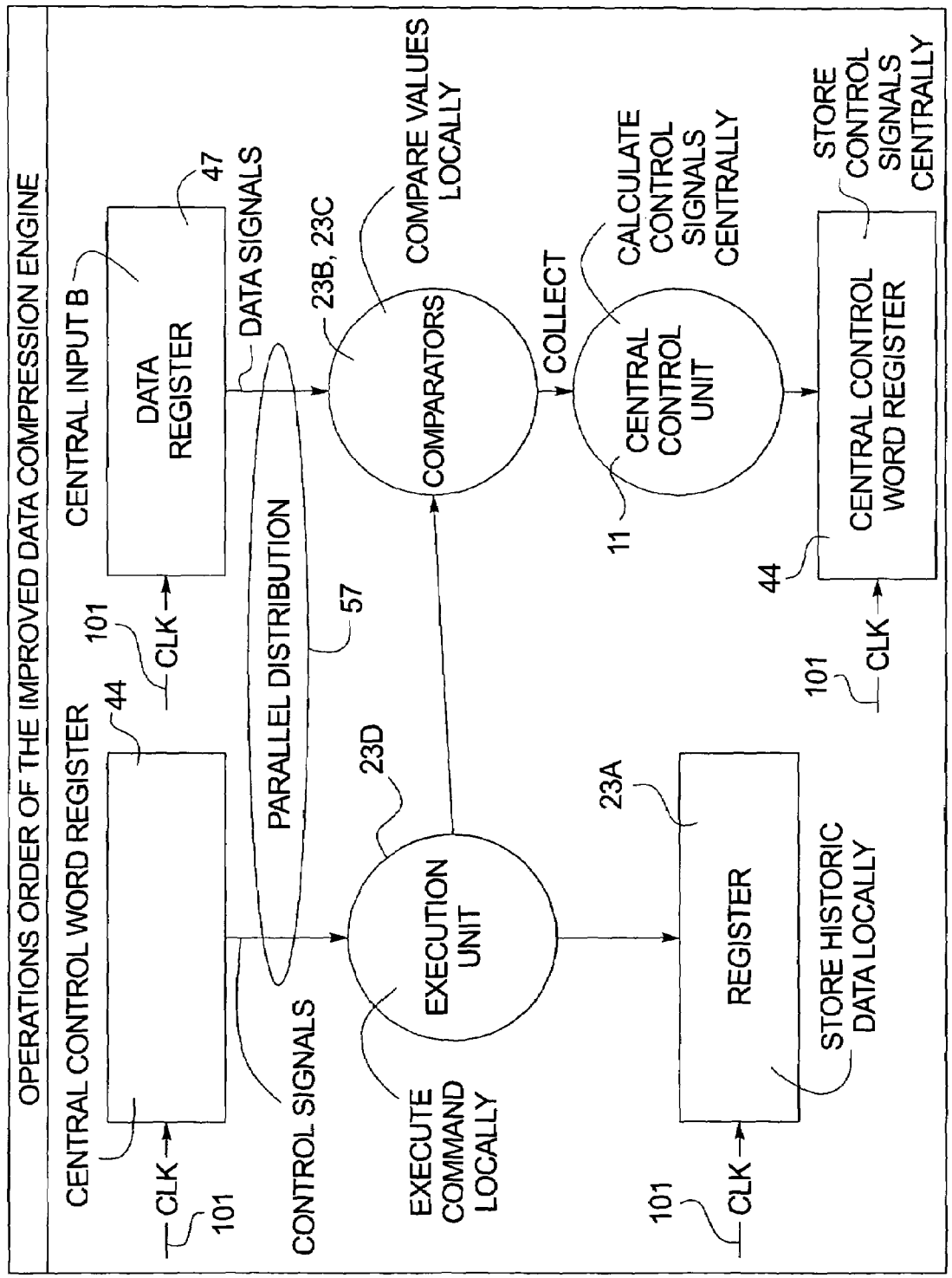
FIG. 4 illustrates the operations order flow in the improved multi-byte data compression engine of FIG. 2.

An operations order or critical path of the data compression engine 10 of FIG. 2 is shown in FIG. 4. A central control word register 44 is provided driven by clock signal 101. This register 44 outputs to execution unit 23D in the history buffer system 12 and executes commands locally. Execution unit 23D outputs to the register 23A driven by clock signal 101, which stores historic data locally. By providing the central control word register 44, this critical path is made shorter both in terms of time and length.

A central input data register 47 driven by clock signal 101 outputs to comparators 23B, 23C which compare values locally. The outputs from the comparators 23B, 23C are input to the central control unit 11 via the hit reduction lines 14 and which calculates the control signals centrally. Central control unit 11 outputs to the central control word register 44 which stores the control signals centrally.

By observing that delays in the data distribution lines 15, hit reduction lines 14, and control signal lines 13 are the most time consuming parts on the critical path, significant speed increases are achieved by the operations order shown in FIG. 4.

Previously mentioned U.S. Pat. No. 5,652,878 teaches, as shown in previously described prior art FIG. 1, the following operations order within a cycle:

1. Distribute data signals from the central data register 2;
2. Perform comparisons locally at comparator 3;
3. Collect hit results sent to calculation unit 4;
4. Compute command at calculation unit 4; and
5. Distribute control signals to execution units 5.

This is the natural ordering of operations used in the prior art. However, note that both operations 1 and 5 are distributions. By delaying operation 5 until the next cycle through use of the central control word register 44 (pipelining) as shown in FIGS. 2 and 4, these two operations are overlapped in time in the improved data compression engine. The new and shorter critical path as shown in FIG. 4 has the following operations order:

1+5. Distribute control and data signals in parallel at the same time as shown at 57;
2. Perform both comparisons locally at comparators 23B, 23C;
3. Collect hit results sent to central control unit 11 on hit reduction lines 14; and
4. Calculate control signals centrally at central control unit 11.

Given that operations 1, 3 and 5 are the most time consuming, this new and improved operations order provides a significant reduction in time delay, as compared to the prior art operations order of FIG. 1 (U.S. Pat. No. 5,652,878).

In conjunction with the use of the improved data compression engine of FIG. 2, a new and improved memory system 27 for a multi-byte decompression engine will now be described with reference to FIG. 5.

Figure 5:
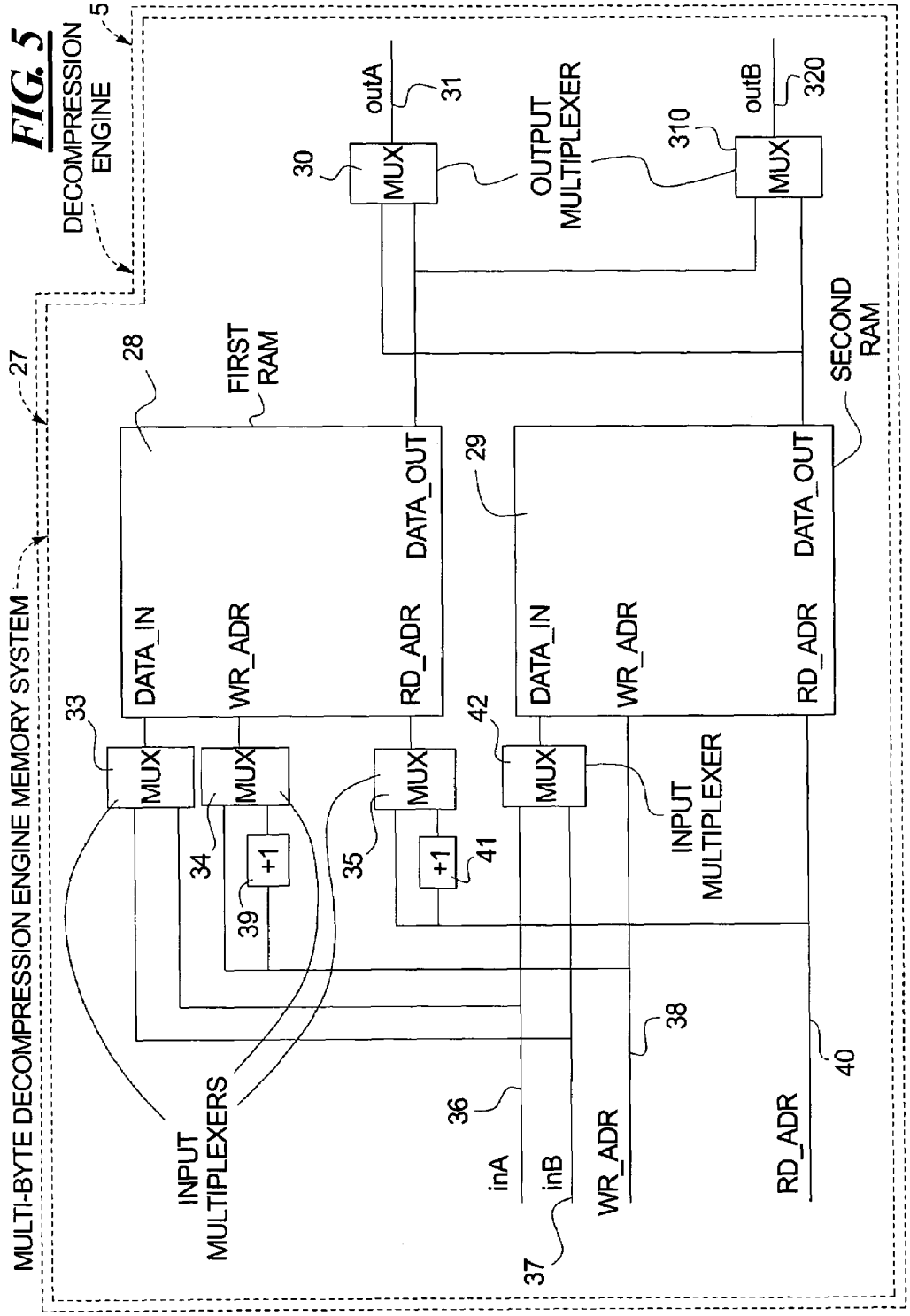
FIG. 5 shows a decompression engine with a memory system for the multi-byte decompression engine comprising an odd-even RAM system useful in conjunction with the multi-byte data compression engine of FIG. 2.

In the preferred embodiment of FIG. 5, a decompression engine 5 with a two byte per clock cycle decompression engine memory system 27 is shown. This system has the following advantages: standard RAMs 28 and 29 are used, as opposed to using a plurality of multiplexers as in the prior art. As a result of this, the system occupies a smaller area and is therefore cheaper to produce. Also the decompression engine is faster using this improved memory system.

The system 27 shown is called an "odd-even RAM system" because it comprises two RAMs, one which stores even history buffer positions, and one which stores odd history buffer positions.

The memory system 27 shown in FIG. 5 will now be described, which provides significant speed increases in conjunction with the fast information gathering and control system data compression engine 10 shown in FIG. 2.

This memory system 27 results in an area-efficient decompression engine that achieves a speed of nearly two bytes per cycle and thus is very useful in conjunction with the data compression engine 10 of FIG. 2.

The system 27 comprises a first RAM 28 and a second RAM 29. These two memories have respective outputs connected to respective inputs of a first multiplexer 30 having an output line 31 designated outA and a second multiplexer 30 having an output line 320 designated outB.

The RAM 28 has respective first, second, and third input multiplexers 33, 34, and 35. The input multiplexer 33 has its inputs connected to input lines 36 and 37. The second input multiplexer 34 has its input lines connected to a write address input line 38 directly and also through an incrementer 39 (which adds +1 to its input). The third input multiplexer 35 has one input connecting to a read address line 40 directly and also through another incrementer 41.

The second RAM 29 has an input multiplexer 42 connected at an input thereof. Also the write address line 38 and the read address line 40 connect to inputs of the second RAM 29. One input to the multiplexer 42 connects to the in A line 36 and the other to the in B line 37.

The use of RAMs has the advantage that they are fast, area efficient, have been studied widely, and have good support in automated layout tools.

If two bytes are to be processed per cycle with one RAM, the RAM would need two read ports and two write ports to achieve sufficient bandwidth. Such RAMs are less area efficient and are not supported by current layout tools. The present improved memory system of FIG. 5 overcomes this problem. The two bytes to be written during a single cycle always have consecutive memory addresses, and the same normally also applies to the two bytes to be read. Two consecutive addresses have different parity. Thus, the history buffer has been divided into two RAMs of half the size, the first RAM 28 for addresses of even parity and the second RAM 29 for addresses of odd parity. Each of these RAMs only needs one set of read and write ports, and thus can be easily and effectively laid out in silicon. The only extra silicon that is required is for control logic.

In the schematic of the odd-even RAM system of FIG. 5, the last bit of the WR_ADR and RD-ADR is only used to control the input multiplexers 33, 34, and 42. The last bit of - RD-_ADR is only used to control the input multiplexer 35 and the output multiplexers 30 and 310.

While a preferred embodiment has been illustrated and described in detail in the drawings and foregoing description, the same is to be considered as illustrative and not restrictive in character, it being understood that only the preferred embodiment has been shown and described and that all changes and modifications that come within the spirit of the invention both now or in the future are desired to be protected.

I claim:

1. A multi-byte data compression and decompression system, comprising:
   a multi-byte data compression engine and a multi-byte data decompression engine; and
   said compression engine comprising a history buffer system receiving uncompressed data, a central control unit having an output with byte match hits connected to the history buffer system, a result generator outputting compressed data and which is connected to the history buffer system to receive hit addresses and also connected to receive said uncompressed data, and the history buffer system comprising a tree module system.

2. A multi-byte data compression and decompression system, comprising:

a multi-byte data compression engine and a multi-byte data decompression engine; and said compression engine comprising a history buffer system receiving uncompressed data, a central control unit connected to the history buffer system, a result generator connected to the history buffer system and also connected to receive said uncompressed data, the history buffer system comprising a tree module system; and the tree module system comprising a plurality of tree leaf modules each having a register, comparators, and an execution unit; a string identifier logic; a selector logic; and an address generation system.

3. A system of claim 2 wherein the tree module system comprises at least two levels, one level comprising a plurality of tree leaf modules and the other level comprising a plurality of modules, with respective tree leaf modules being associated with respective ones of said modules.

4. A multi-byte data compression and decompression system, comprising:

a multi-byte data compression engine and a multi-byte data decompression engine;

said compression engine comprising a history buffer system receiving uncompressed data, a central control unit connected to the history buffer system, a result generator connected to the history buffer system and also connected to receive said uncompressed data, the history buffer system comprising a tree module system; and said tree module system comprising a selector logic which retrieves string match results from tree leaf modules through tree connections; a string identifier logic; and an address generation system.

5. A multi-byte data compression and decompression system, comprising:

a multi-byte data compression engine and a multi-byte data decompression engine; and said compression engine comprising a history buffer system receiving uncompressed data, a central control unit connected to the history buffer system, a result generator connected to the history buffer system and also connected to receive said uncompressed data, the history buffer system comprising a tree module system; and said tree module system comprising tree connections to a plurality of tree leaf modules, said tree connections being connected to receive said uncompressed data and control signals, and said tree connections also being connected to output lines for hits and hit addresses, and wherein link connections are provided between respective tree leaf modules.

6. A multi-byte data compression and decompression system, comprising:

a multi-byte data compression engine and a multi-byte data decompression engine;

said compression engine comprising a history buffer system receiving uncompressed data, a central control unit connected to the history buffer system, a result generator connected to the history buffer system and also connected to receive said uncompressed data, and the history buffer system comprising a tree module system; and said central control unit connecting to the history buffer system by a control signal line connected to a central control word register which has an output connected to said history buffer system.

7. A system of claim 4 wherein said uncompressed data is received from a central input data register.

8. A multi-byte data compression and decompression system, comprising:

a multi-byte data compression engine and a multi-byte data decompression engine;

said compression engine comprising a history buffer system receiving uncompressed data, a central control unit connected to the history buffer system, a result generator connected to the history buffer system and also connected to receive said uncompressed data, and the history buffer system comprising a tree module system, and said multi-byte data decompression engine comprising a memory system comprising a first RAM which stores addresses with an even parity and a second RAM which stores addresses with an odd parity.

9. A system of claim 8 wherein the compressed data and associated addresses are input via multiplexers to the first and second RAMs and decompressed data is output via multiplexers from the first and second RAMs.

10. A multi-byte data compression and decompression system, comprising:

a data compression engine;

a multi-byte data decompression engine; and said data decompression engine comprising a memory system comprising a first RAM which stores addresses with an even parity and a second RAM which stores addresses with an odd parity, compressed data and associated addresses being input to said first and second RAMs and decompressed data output lines being connected to said first and second RAMs.

11. A system of claim 10 wherein multiplexers connect the compressed data and relevant addresses to the first and second RAMs and multiplexers connect the output lines having the decompressed data to outputs of the first and second RAMs.

12. A multi-byte data compression and decompression system, comprising:

a multi-byte data compression engine and a multi-byte data decompression engine; and said compression engine comprising a history buffer system receiving uncompressed data, a result generator also receiving said uncompressed data and outputting compressed data, a hit address output from said history buffer system to said result generator, a central control unit having an output for control signals to said history buffer system and an input for receiving hits from said history buffer system, and a central control word register feeding said control signals from said central control unit to said history buffer system.

13. A system of claim 12 wherein a central input data register connects said uncompressed data to said history buffer system and result generator.

14. A method for multi-byte data compression and decompression, comprising the steps of:

storing previously received data bytes of uncompressed data;

comparing the stored previously received data bytes to currently received data bytes to determine whether at least one or more of the data bytes match at least one or more of the stored data bytes;

generating addresses of matching stored data bytes;

utilizing a tree module system for said storing, comparing, and generating addresses;

utilizing said addresses and corresponding byte matches to create compressed data; and decompressing said compressed data.

15. A method of claim 14 including the step of creating said decompressed data by use of a data decompression engine with a memory system having at least a first RAM which stores even history buffer positions and a second RAM which stores odd history buffer positions.

16. A method of claim 14 including the step of providing a central control unit sending control signals to a history buffer system via a central control word register.

17. A method of claim 14 wherein uncompressed data is fed to a history buffer system via a central input data register system.

18. A method for multi-byte data compression and decompression, comprising the steps of:

compressing the data by providing an operation order with parallel distribution of control signals and data signals;

utilizing a central input data register which outputs the data signals to comparators which compare values locally;

collecting the results to a central control unit which calculates control signals centrally, said control signals being stored in a central control word register;

outputting the control signals from said central control word register to an execution unit which executes commands locally, outputs to a register which stores historic data locally, and sends results to said comparators;

utilizing a result generator to generate the compressed data; and decompressing the compressed data.

19. A method of claim 18 including the step of decompressing the data by use of a RAM which stores addresses of an even parity and a second RAM stores addresses with an odd parity.

* * * * *